United States Patent
Yueh et al.

(10) Patent No.: US 10,991,682 B2
(45) Date of Patent: Apr. 27, 2021

(54) ELECTRONIC DEVICE

(71) Applicant: InnoLux Corporation, Miao-Li County (TW)

(72) Inventors: Jui-Jen Yueh, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/425,939

(22) Filed: May 29, 2019

(65) Prior Publication Data
US 2020/0381410 A1   Dec. 3, 2020

(51) Int. Cl.
*H01L 25/16*   (2006.01)
*H01L 27/12*   (2006.01)

(52) U.S. Cl.
CPC ........ *H01L 25/167* (2013.01); *H01L 27/1218* (2013.01)

(58) Field of Classification Search
CPC .................... H01L 25/167; H01L 27/1218
See application file for complete search history.

(56) References Cited

U.S. PATENT DOCUMENTS

| | | | | |
|---|---|---|---|---|
| 2002/0153569 A1* | 10/2002 | Katayama | ......... | H01L 29/78654 257/351 |
| 2007/0108443 A1* | 5/2007 | Kim | ............ | H01L 27/3202 257/40 |
| 2012/0168776 A1* | 7/2012 | Nakamura | .......... | H01L 27/3288 257/80 |
| 2014/0151652 A1* | 6/2014 | Im | ............... | H01L 51/5228 257/40 |
| 2017/0005152 A1* | 1/2017 | Hong | ............ | H01L 29/78621 |
| 2017/0358505 A1* | 12/2017 | Chang | ............ | H01L 22/22 |
| 2018/0254226 A1* | 9/2018 | Iguchi | ............ | H01L 25/0753 |
| 2018/0277524 A1 | 9/2018 | Moon | | |

* cited by examiner

*Primary Examiner* — Herve-Louis Y Assouman
(74) *Attorney, Agent, or Firm* — Winston Hsu

(57) ABSTRACT

An electronic device is disclosed, the electronic device includes a substrate, a first auxiliary electrode formed on the substrate, an organic layer formed on the first auxiliary electrode, a first inorganic layer formed on the organic layer, a plurality of thin film transistors formed on the first inorganic layer, and a plurality of electronic units electrically connected to the plurality of thin film transistors, wherein the first auxiliary electrode is electrically connected to at least two of the plurality of electronic units.

19 Claims, 12 Drawing Sheets

ELECTRONIC DEVICE

BACKGROUND OF THE DISCLOSURE

1. Field of the Disclosure

The present disclosure relates to an electronic device, and more particularly to an electronic device having uniform brightness.

2. Description of the Prior Art

The electronic devices are widely used, but the brightness of the electronic device is not uniform as the size or resolution is enhanced, and therefore the quality of the electronic device is diminished. Thus, this problem needs to be reduced.

SUMMARY OF THE DISCLOSURE

According to an embodiment, the present disclosure provides an electronic device including a substrate, a first auxiliary electrode formed on the substrate, an organic layer formed on the first auxiliary electrode, a first inorganic layer formed on the organic layer, a plurality of thin film transistors formed on the first inorganic layer, and a plurality of electronic units electrically connected to the plurality of thin film transistors, wherein the first auxiliary electrode is electrically connected to at least two of the plurality of electronic units.

These and other objectives of the present disclosure will no doubt become obvious to those of ordinary skill in the art after reading the following detailed description of the embodiment that is illustrated in the various figures and drawings.

DETAILED DESCRIPTION

Figure 1:
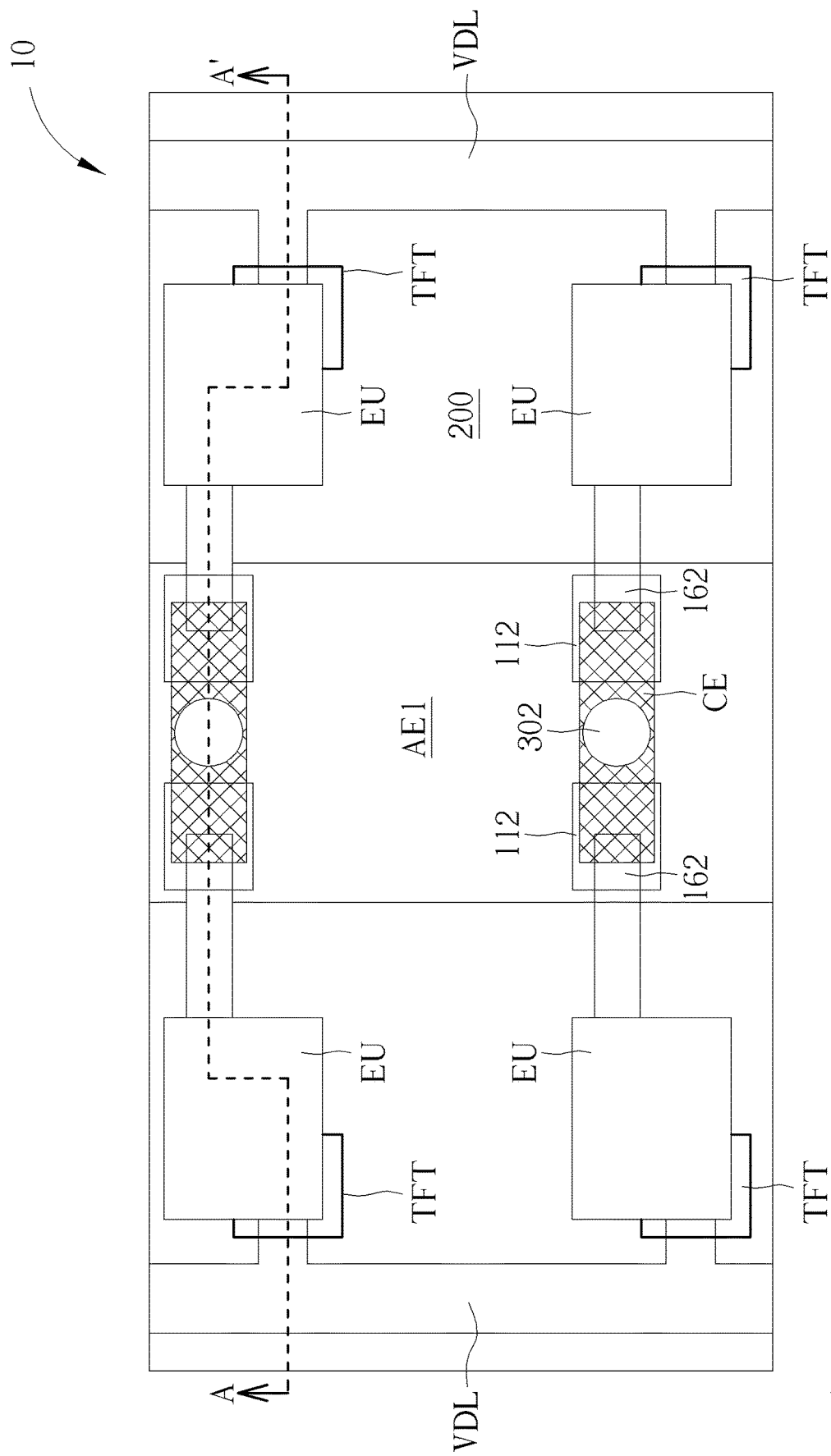
FIG. 1 is a schematic diagram showing a top view of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of an electronic device (i.e. a display device in this disclosure), and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

It will be understood that when an element or layer is referred to as being "(electrically) connected to" another element or layer, it can be directly (electrically) connected to the other element or layer, or intervening elements or layers may be presented. In contrast, when an element is referred to as being "directly (electrically) connected to" another element or layer, there are no intervening elements or layers presented. In contrast, when an element is referred to as being "disposed on" or "formed on" A element, it may be directly disposed on (or formed on) A element, or may be indirectly disposed on (or formed on) A element through other component. In contrast, when an element is referred to as being "disposed between" A element and B element, it may be directly disposed between A element and B element, or may be indirectly disposed between A element and B element through other component.

The terms "about", "substantially", "equal", or "same" generally mean within 20% of a given value or range, or mean within 10%, 5%, 3%, 2%, 1%, or 0.5% of a given value or range.

In addition, the phrase "in a range from a first value to a second value" indicates the range includes the first value, the second value, and other values in between.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

It will be understood that when "A element is electrically connected to the thin film transistor" or "A element is electrically connected to the B element through the thin film transistor", which may be in a condition that the thin film transistor is turned on.

In the present disclosure, the electronic device may include a LED (light-emitting diode) display, a micro-LED display, a mini-LED display, an OLED (organic light-emitting diode) display, a quantum dots LEDs (QLEDs or QD-LEDs) display, a fluorescence display, a phosphor display, a flexible display, other suitable displays, or a combination thereof, but not limited thereto.

Figure 2:
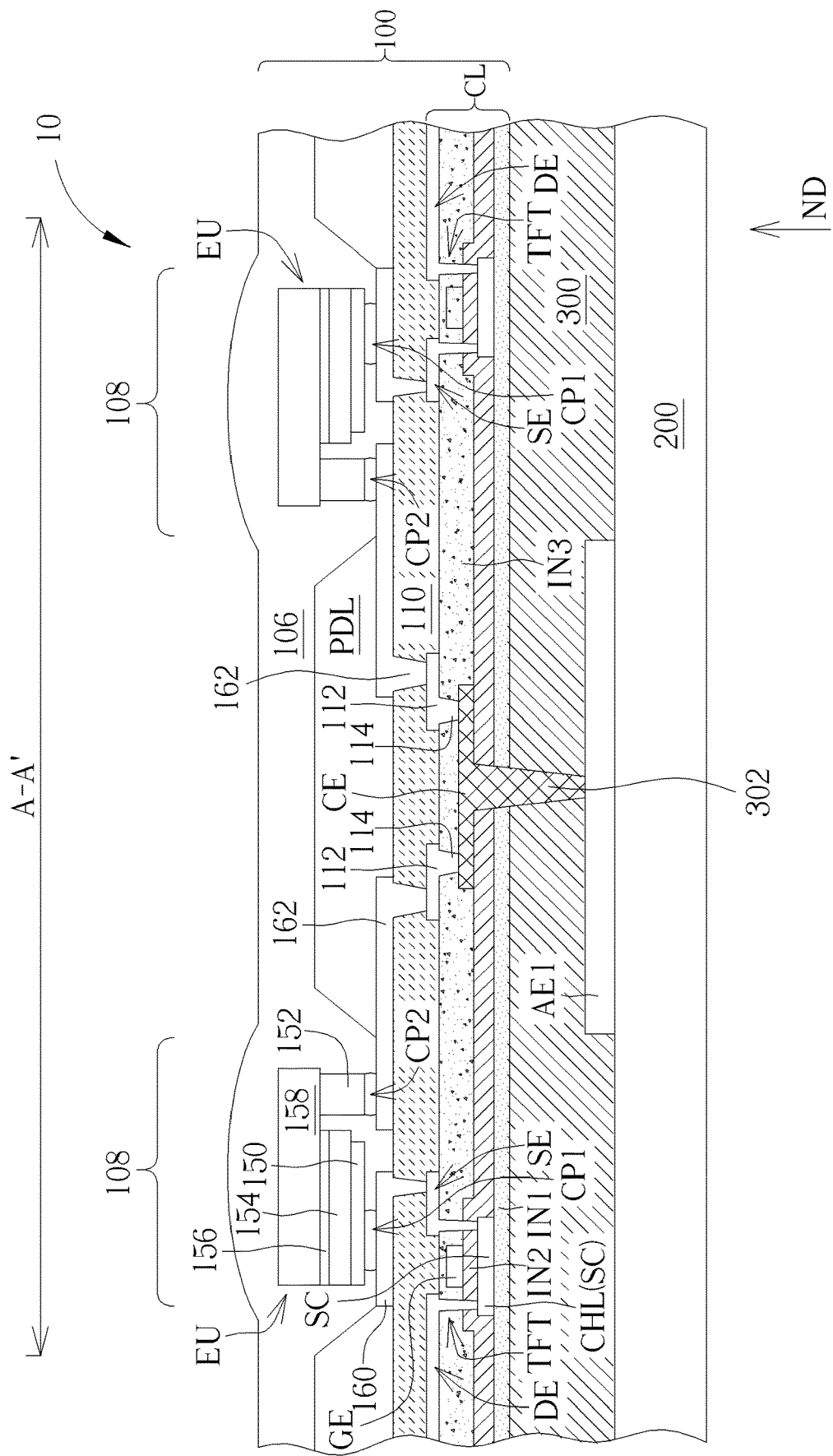
FIG. 2 is a schematic diagram showing a cross-sectional view of an electronic device according to the first embodiment of the present disclosure.

Referring to FIG. 1 to FIG. 2, FIG. 1 is a schematic diagram showing a top view of an electronic device according to a first embodiment of the present disclosure, and FIG. 2 is a schematic diagram showing a cross-sectional view of an electronic device along the cross-sectional line A-A' shown in FIG. 1. As shown in FIG. 1 and FIG. 2, an electronic device 10 includes a substrate 200 and a light emitting structure 100 disposed on the substrate 200. The substrate 200 may include a rigid substrate or a flexible substrate, wherein the substrate may include a glass substrate, a plastic substrate, a quartz substrate, a sapphire substrate, a polyimide (PI) substrate, a polyethylene terephthalate (PET) substrate, other suitable substrate, or a combination thereof, but not limited thereto.

In some embodiments, the light emitting structure 100 is formed on the substrate 200, but the light emitting structure 100 does not directly contact the substrate 200, other elements (such as an organic layer 300 and a first auxiliary electrode AE1, it will be described in detail later) may be formed between the light emitting structure 100 and the substrate 200. The light emitting structure 100 may include a plurality of electronic units EU, a circuit layer structure CL, wherein the plurality of electronic units EU are disposed on or formed on the circuit layer structure CL, the circuit layer structure CL may include wires (such as scan lines, data lines or other wires), thin film transistors TFT (such as switch elements, driving elements, reset elements and/or compensating elements), but not limited thereto. In some embodiments, the electronic device may include a plurality of sub-pixels 108, the sub-pixel 108 may include the corresponding electric unit EU, the electric units EU can emit light, and different electric units EU in different sub-pixels 108 can emit light with different colors (such as red light, blue light or green light). In some embodiments, the different electric units EU can emit the same color lights (such as white light and/or UV light), the light conversion layers (not shown) may be disposed on the electric units EU, and the light conversion layers may convert or filter the white light (or UV light) to red light, green light, blue light or the light with any other suitable wavelength. The material of the light conversion layers may include quantum dots, color filter, phosphorescent materials or any other suitable material, but not limited thereto. In some embodiments, the sub-pixel 108 may include at least one corresponding electronic unit EU and at least one corresponding thin film transistor TFT electrically connected to the corresponding electronic units EU.

In some embodiments (FIG. 1 and FIG. 2), the circuit layer structure CL is disposed on or formed on the substrate 200, and the electronic units EU and/or the pixel defining layer PDL are disposed on or formed on the circuit layer structure CL, and the pixel defining layer PDL may be configured to separate the electronic units EU from each other. In detail, the circuit layer structure CL may include at least one conductive layer(s), at least one insulating layer(s) and/or at least one semiconductor layer(s) to form different electronic components (such as wires, thin film transistors, capacitor or other suitable components), and the electronic units EU are electrically connected to at least one of the thin film transistors respectively.

In some embodiments (FIG. 1 and FIG. 2), the circuit layer structure CL may include a first insulating layer IN1, a second insulating layer IN2, a third insulating layer IN3, a semiconductor layer SC, a first conductive layer forming the gate electrodes GE and/or scan lines (not shown), a second conductive layer forming the source electrodes SE, the drain electrodes DE and/or data lines (not shown), but it is not limited thereto. A thin film transistor TFT may include a source electrode SE, a drain electrodes DE, a gate electrode GE and a channel layer CHL. The source electrode SE of the thin film transistor TFT (such as driving element) may be electrically connected to a power supply line VDL (such as VSS or ground, but it is not limited) through the first auxiliary electrode AE1, but it is not limited thereto. The drain electrode DE of the thin film transistor TFT (such as driving element) may be electrically connected to a power supply line VDL (such as VDD, but it is not limited thereto). In some embodiments, the position of the drain electrode DE may be exchanged with the position of the source electrode SE. In some embodiments, the thin film transistor TFT may include a bottom gate transistor, a top gate transistor, a double gate transistor, a dual gate transistor, other suitable transistor or combination thereof, but not limited thereto. The type of the thin film transistor TFT and the disposition of the components may be adjusted according to requirements.

The material of the conductive layers (such as the gate electrode GE, the source electrode SE and the electrode drain DE) in the circuit layer structure CL may include metal or transparent conductive material, wherein the transparent conductive material can include indium tin oxide (ITO), indium zinc oxide (IZO), any other suitable conductive material or a combination thereof, but it is not limited thereto. The material of the insulating layers (such as the first insulating layer IN1, the second insulating layer IN2, the third insulating layer IN3) in the circuit layer may include silicon oxide, silicon nitride, silicon oxynitride, any other suitable insulating material or a combination thereof, but it is not limited thereto. The material of the semiconductor layer SC may include low temperature poly-silicon (LTPS), indium gallium zinc oxide (IGZO), amorphous silicon (a-Si) and/or any other suitable semiconductor material or combination thereof, but not limited thereto. The material of the pixel defining layer PDL may include any suitable insulating material. In some embodiments (FIG. 1), the pixel defining layer PDL includes a plurality of openings to define different sub-pixels 108.

The electronic units EU may include an inorganic light emitting diode (LED), a micro-LED, a mini-LED, an organic light-emitting diode (OLED), any other suitable light-emitting component, or a combination thereof, but not limited thereto, but not limited thereto. The present disclosure uses the LED (such as micro-LED or mini-LED) to serve as the electronic units EU for explanation, but the electronic units EU may be other type of light-emitting components. In some embodiments, the electronic units EU may include a first electrode 150, a second electrode 152, a first semiconductor layer 154, alight emitting layer 156, and a second semiconductor layer 158. In some embodiments, the material of the first electrode 150 or the second electrode 152 may include metal and/or transparent conductive material.

In some embodiments, the first electrode 150 may be an anode electrode that may be electrically connected to a pixel electrode 160 through a conductive pad CP1, and the first electrode 150 may be electrically connected to the source electrode SE of a thin film transistor TFT (such as driving element), but it is not limited thereto. In some embodiments, the position of the drain electrode DE may be exchanged with the position of the source electrode SE. In some embodiments, the second electrode 152 may be a cathode electrode, and the second electrode 152 may be electrically connected to a common electrode 162 through a conductive pad CP2, and the common electrode 162 may be provided with a first voltage (such as common voltage) through the first auxiliary electrode AE1, and the first auxiliary electrode AE1 will be described more detail in the following paragraphs. In some embodiments, the first electrode 150 may be a cathode electrode, and the second electrode 152 may be an anode electrode. In some embodiments (FIG. 2), at least two electronic units EU are electrically connected to each other through a connection electrode CE. In some embodiments, the connection electrode CE may electrically connected to at least two electronic units EU, and the common electrode 162 may electrically connected with the electronic units EU and the connection electrode CE. In some embodiments (FIG. 2), the connection pads 112 and/or the conductive via 114 may be electrically connected to the connection electrode CE and the common electrodes 162 for electrically connecting at least two electronic units EU to the connection electrode CE. It should be noted that the conductive via may be a via filled with conductive materials.

In some embodiments (FIG. 2) the electronic device 10 may include a protection layer 106 disposed on the electronic units EU, and/or a planarization layer 110 selectively disposed between the electronic units EU and the circuit layer structure CL, but it is not limited thereto. The protection layer 106 may include an insulating material layer, other suitable materials or combination thereof, but not limited thereto. In some embodiments, the planarization layer 110 may be an organic layer, such as a polyimide (PI), a polycarbonate (PC), acrylate, other suitable materials or combination thereof, but not limited thereto. In some embodiments, the protection layer 106 can be replaced by a cover layer (not shown). In some embodiments, an anti-refection layer (not shown) and/or a touch layer (not shown) may be disposed on the electronic units EU.

It should be noted that, the electronic units EU may include antenna units, sensor units, light emitting units, display units, other suitable units or a combination thereof, but it is not limited thereto.

In a conventional display device, the resistance of the power line electrically connected with the electronic units EU may be high, so the light emitted from two different electronic units EU may have different light intensities, or the brightness uniformity may reduce.

To reduce the issues mentioned above, in the present disclosure, an auxiliary electrode (such as first auxiliary electrode AE1) is formed between the substrate 200 and the circuit layer structure CL, and the auxiliary electrode (such as first auxiliary electrode AE1) transmits a constant voltage to at least two of the plurality of electronic units through the connection electrode CE and/or the common electrode 162, and the non-uniformity of the brightness of the electronic device may be reduced.

In some embodiments, a first auxiliary electrode AE1 is disposed on or formed on the substrate 200, and the organic layer 300 is formed on the first auxiliary electrode AE1, and the first auxiliary electrode AE1 is disposed between the substrate 200 and the first insulating layer IN1. A conductive via 302 is disposed in the organic layer 300 and electrically connected to the first auxiliary electrode AE1 and the connection electrode CE, but it is not limited thereto. In other words, the conductive via 302 may penetrate the organic layer 300, the first insulating layer IN1 and/or the second insulating layer IN2 to electrically connect the at least two of the electronic units EU (such as two adjacent ones of the electronic units EU, but it is not limited thereto) and the first auxiliary electrode AE1 shown in FIG. 2. In some embodiments, the organic layer 300 may include polyimide (PI) layer or other suitable organic layers, but it is not limited thereto. In some embodiments, the thickness of the organic layer 300 can be in a range from 10 μm to 50 μm (10 μm≤thickness≤50 μm), but not limited thereto. In some embodiments, the thickness of the organic layer 300 can be in a range from 10 μm to 30 μm (10 μm≤thickness≤30 μm). In some embodiments, the thickness of the organic layer 300 can be in a range from 20 μm to 40 μm (20 μm≤thickness≤40 μm). In some embodiments (FIG. 2), at least part of the organic layer 300 directly contacts the substrate 200. In some embodiments, the first insulating layer IN1 may include an inorganic layer, such as a silicon oxide layer, a silicon nitride layer, other suitable materials or a combination thereof, but not limited thereto. The first insulating layer IN1 may be disposed between the thin film transistors TFT and the first auxiliary electrode AE1.

In some embodiments, the first auxiliary electrode comprises a material selected from a group consisting of Cu, Ag, Au and other suitable material. In some embodiments, the material of the first auxiliary electrode AE1 includes conductive materials, for example Cu, Ag, Au, other suitable materials or a combination thereof, but not limited thereto. In some embodiments, a thickness of the first auxiliary electrode AE1 can be in a range from 1 μm to 6 μm (1 μm≤thickness≤6 μm), but not limited thereto. In some embodiments, the thickness of the first auxiliary electrode AE1 can be in a range from 3 μm to 6 μm (3 μm≤thickness≤6 μm). The first auxiliary electrode AE1 can provide or transmit a first voltage (e.g. constant voltage) to at least two of the electronic units EU through the connection electrode CE. In the present disclosure, the constant voltage may be defined by measuring the voltage at a same position of the auxiliary electrode (such as first auxiliary electrode AE1) within 30 frames, and the variation of the voltage is lower than ±3%, but not limited thereto. In some embodiments, the common voltage may be same as the first voltage.

It is worth noting that, one of the plurality of thin film transistors TFT comprises a channel layer CHL formed of the semiconductor layer SC. In some embodiments, the channel layer CHL may be defined as a portion of the semiconductor layer SC overlapping the corresponding gate electrode GE. In some embodiments (FIG. 2), the channel layer CHL may be not overlapped with the first auxiliary electrode AE1 in a normal direction ND of the surface of the substrate 200. In some embodiments, as shown in FIG. 1, the thin film transistor TFT does not overlapped with the first auxiliary electrode AE1 in the normal direction ND of the surface of the substrate 200 for reducing the impact from the capacitances.

The channel layer CHL in the thin film transistor TFT does not overlap with the first auxiliary electrode AE1. The organic layer 300 disposed on the first auxiliary electrode AE1 may provide a flatter surface for forming the circuit layer structure CL.

The electronic device of the present disclosure is not limited to the above mentioned embodiment. Further embodiments or variant embodiments of the present disclosure are described below. It should be noted that the technical features in different embodiments described can be replaced, recombined, or mixed with one another to constitute another embodiment without departing from the spirit of the present disclosure. For making it easier to compare the difference between the embodiments and variant embodiments, the following description will detail the dissimilarities among different variant embodiments or embodiments and the identical features will not be redundantly described.

Figure 3:
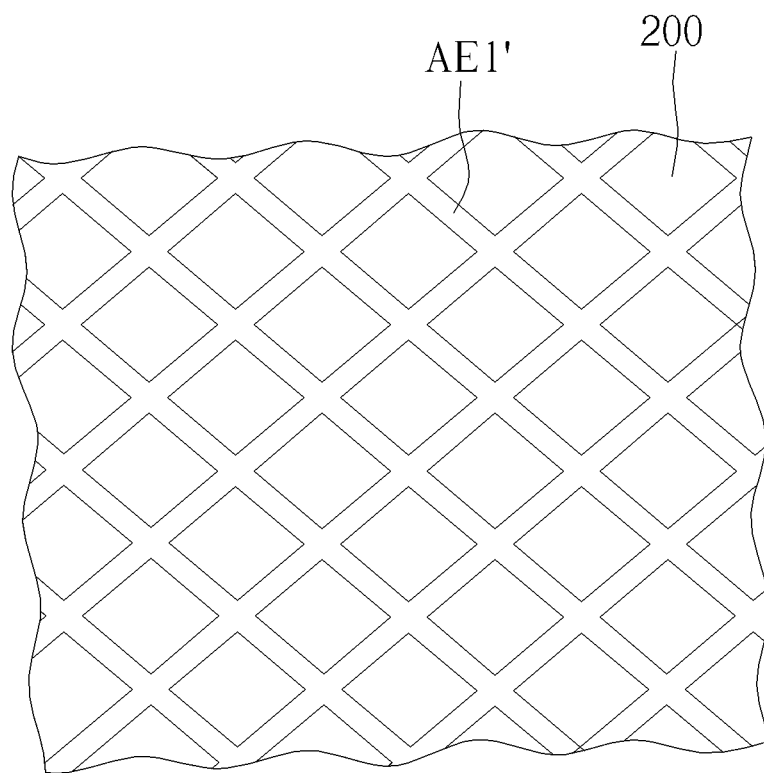
FIG. 3 is a schematic diagram showing a top view of the first auxiliary electrode according to another embodiment of the present disclosure.

In the first embodiment (FIG. 1) mentioned above, the shape of the first auxiliary electrode AE1 may include rectangle shape or line shape in the normal direction ND of the surface of the substrate 200, and the first auxiliary electrode AE1 may extend along a direction D1, but not limited thereto. In some embodiments, the direction D1 may be an extinction direction of the data line (not shown) or an extinction direction of the power supply line VDL, but not limited thereto. In some embodiments, the first auxiliary electrode AE1 can be provided with a first voltage (such as constant voltage), and the first voltage may be providing or transmitting by a voltage supper (not shown) or a circuit board (not shown). However, in other embodiments, the shape of the first auxiliary electrode AE1 can be adjusted according to demand. For example, FIG. 3 is a schematic diagram showing a top view of the first auxiliary electrode AE1 according to another embodiment of the present disclosure. In order to simplify the illustration, only the first auxiliary electrode AE1 and the substrate 200 are shown in FIG. 3, and other components are omitted from the figure. As shown in FIG. 3, the shape of a first auxiliary electrode AE1' may include mesh shape. In some embodiments, the shape of the first auxiliary electrode AE' in the normal direction ND of the surface of the substrate 200 may include round shape, arc shape, rectangle shape with curved corners, mesh shape, line shape, other suitable shapes or a combination thereof, but not limited thereto.

Figure 4:
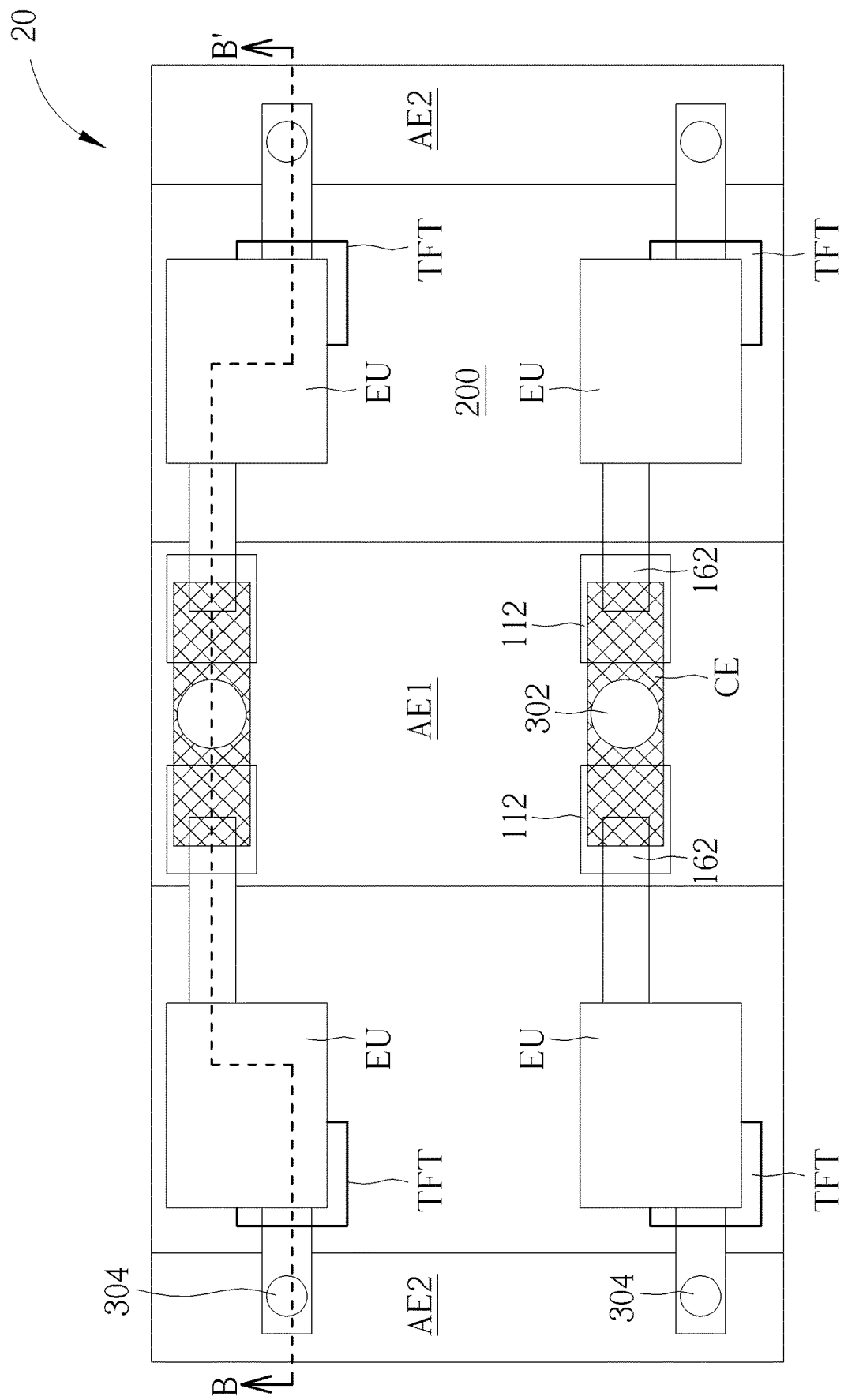
FIG. 4 is a schematic diagram showing a top view of an electronic device according to a second embodiment of the present disclosure.
Figure 5:
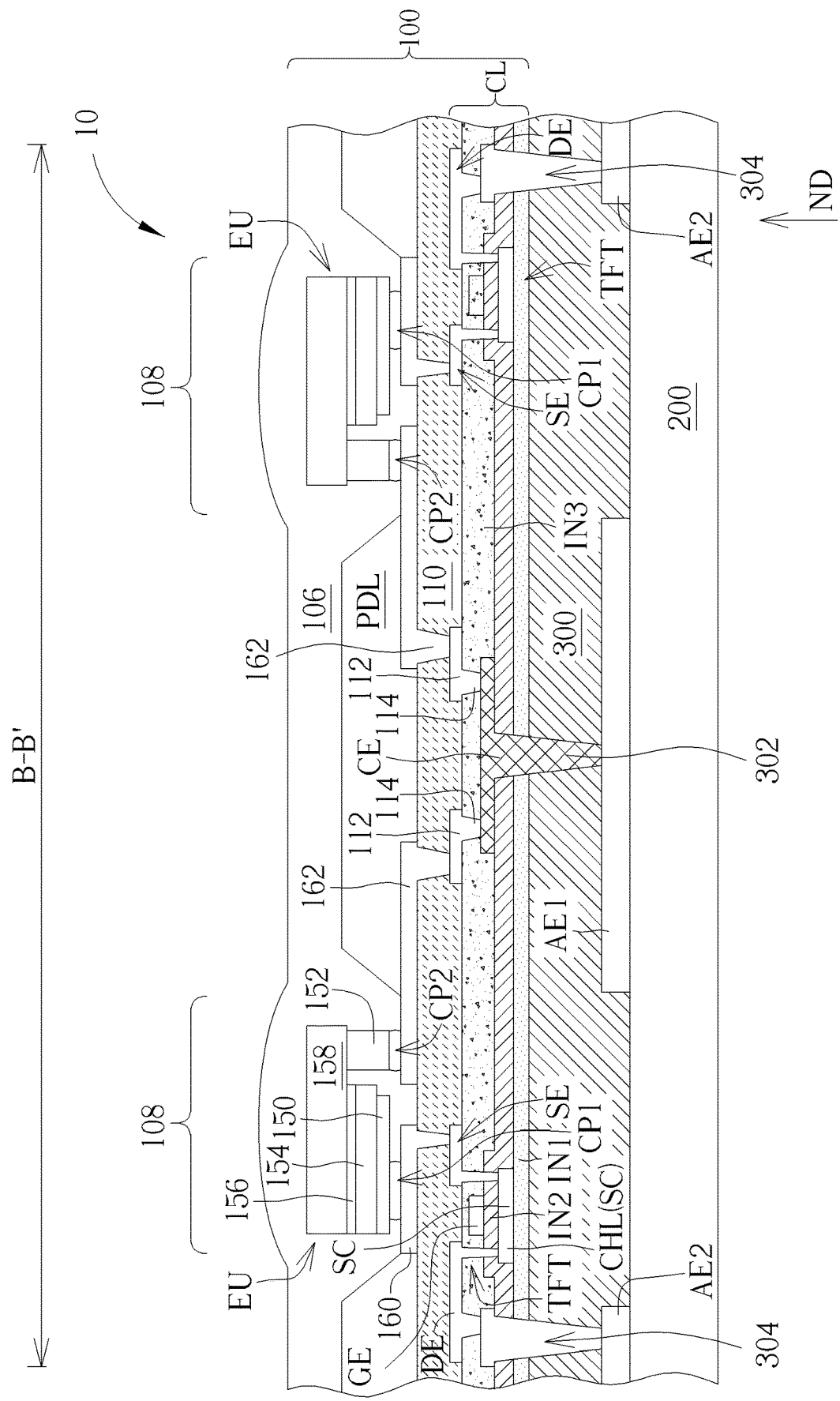
FIG. 5 is a schematic diagram showing a cross-sectional view of an electronic device according to the second embodiment of the present disclosure.

FIG. 4 is a schematic diagram showing a top view of an electronic device according to a second embodiment of the present disclosure, FIG. 5 is a schematic diagram showing a cross-sectional view of an electronic device according to the second embodiment of the present disclosure. As shown in FIG. 4, the difference between the first embodiment and the second embodiment is that, at least one second auxiliary electrode AE2 is disposed on or formed on the substrate 200, and the at least one second auxiliary electrode AE2 is electrically connected to at least one of the electronic units through the corresponding thin film transistor TFT and/or the conductive via 304. More detail, as shown in FIG. 5, the second auxiliary electrode AE2 may be disposed on the substrate 200, and the second auxiliary electrode AE2 may be disposed between the substrate 200 and the organic layer 300. A conductive via 304 may be formed in the organic layer 300, and the conductive via 304 is electrically connected to the second auxiliary electrode AE2 and the thin film transistor TFT (such as a drain electrode DE in the thin film transistor TFT, but not limited thereto). In some embodiments, the second auxiliary electrode AE2 (not shown) is provided with a second voltage (such as a constant voltage), and the second voltage may be provided or transmitted by a voltage supper (not shown) or a circuit board (not shown). Then, the second auxiliary electrode AE2 may provide the second voltage to the electronic units E. The second auxiliary electrode AE2 may provide the second voltage to the electronic units E through the thin film transistors TFT and the pixel electrode 160. In some embodiments, the first voltage can be different from the second voltage. For example, the second voltage and the first voltage may have different potentials, such as positive potential, negative potential or ground potential. In some embodiments (not shown), the at least one second auxiliary electrode AE2 is electrically connected to at least two of the electronic units through the corresponding thin film transistor TFT, and/or the corresponding conductive via 304. In some embodiments, the second auxiliary electrode AE2 may be electrically connected to a power supply line VDL (such as VDD), and the first auxiliary electrode AE1 be electrically connected to a power supply line VDL (such as VSS), but it is not limited thereto.

In some embodiments, the shape of the second auxiliary electrodes AE2 can be adjusted according to actual requirements. In some embodiments, the shape of the second auxiliary electrodes AE2 may include round shape, arc shape, rectangle shape with curved corners, mesh shape, line shape, other suitable shapes or a combination thereof, but not limited thereto. However, it should be noted that, the second auxiliary electrodes AE2 need to be electrically insulated from the first auxiliary electrodes AE1. In some embodiments (not shown), the second auxiliary electrodes AE2 may electrically connected to at least two electronic units EU.

Figure 6:
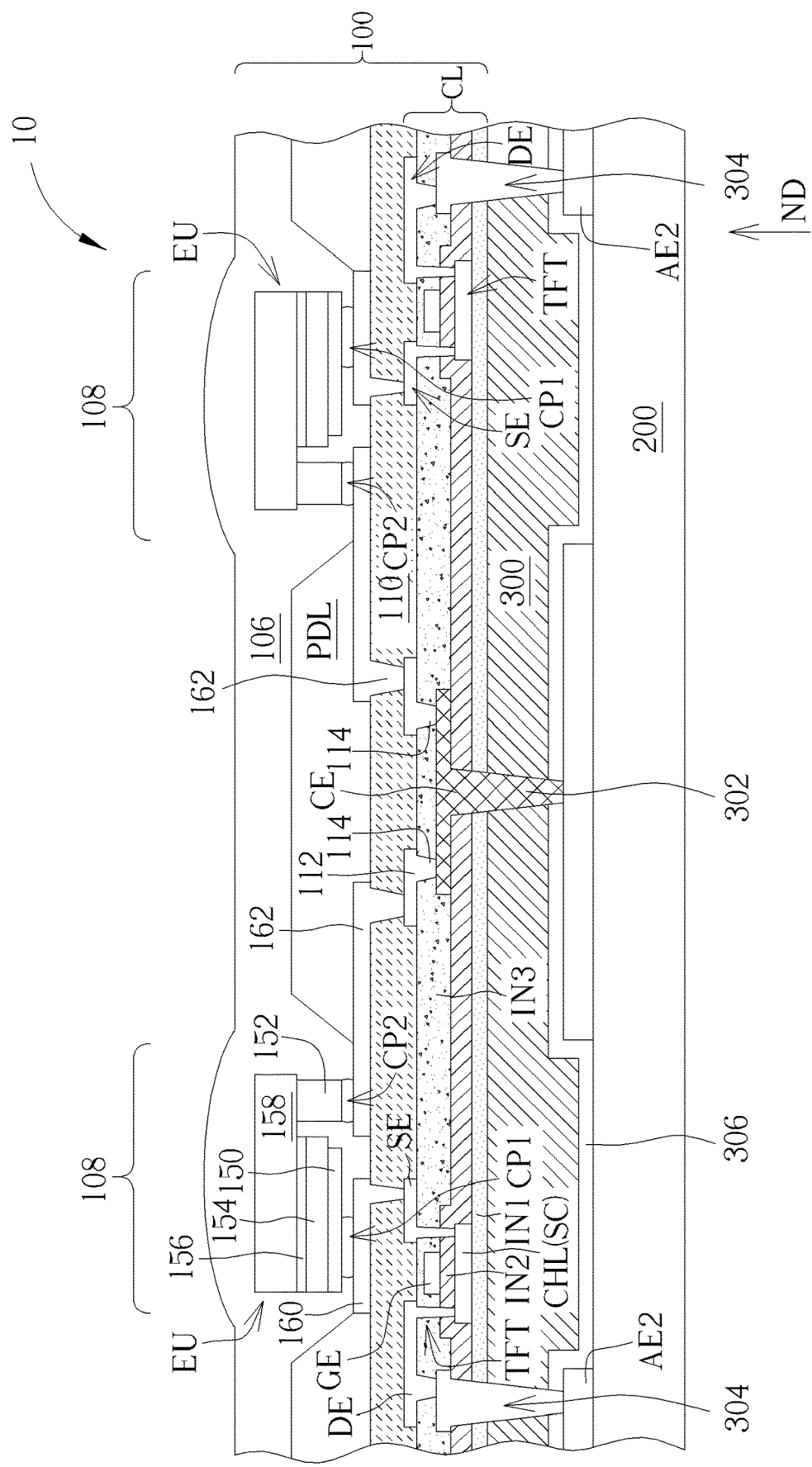
FIG. 6 is a schematic diagram showing a cross-sectional view of an electronic device according to the third embodiment of the present disclosure.

FIG. 6 is a schematic diagram showing a cross-sectional view of an electronic device according to the third embodiment of the present disclosure. As shown in FIG. 6, the difference between the first embodiment and third embodiment is that, a second inorganic layer 306 (such as a buffer layer) is further disposed on or formed on the substrate 200, and the second inorganic layer 306 may cover the first auxiliary electrodes AE1 and/or the second auxiliary electrodes AE2. In some embodiments, the second inorganic layer 306 may be disposed between the substrate 200 and the organic layer 300. In some embodiments, the material of the second inorganic layer 306 may include inorganic material or organic material or a combination thereof, but not limited thereto. The material of the second inorganic layer 306 may include polyimide, silicon oxide, silicon nitride, silicon oxynitride polyimide other suitable materials, or a combination thereof, but not limited thereto.

The conductive via 302 and/or the conductive via 304 may penetrate the second inorganic layer 306 and/or the organic layer 300 to electrically connect the first auxiliary electrodes AE1 and/or the second auxiliary electrodes AE2 respectively. A better adhesion is between the second inorganic layer 306 and the substrate 200, and the second inorganic layer 306 may be used as an adhesion layer between the organic layer 300 and the substrate 200, or the second inorganic layer 306 can reduce the atomic diffusion from the auxiliary electrode (AE1, AE2) to semiconductor layer SC in a high temperature process environment, or increase the yield of the electronic device.

Figure 7:
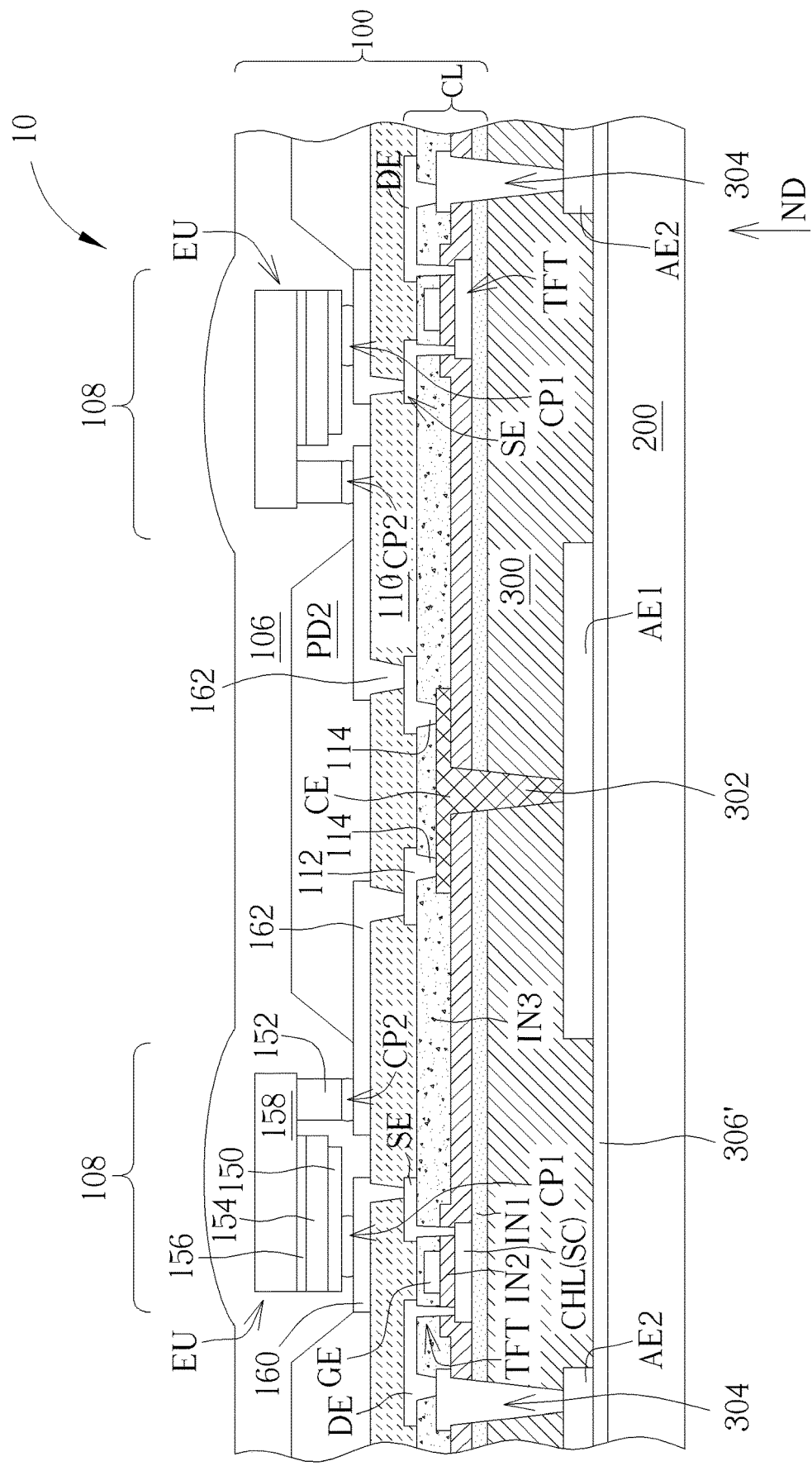
FIG. 7 is a schematic diagram showing a cross-sectional view of an electronic device according to the fourth embodiment of the present disclosure.

FIG. 7 is a schematic diagram showing a cross-sectional view of an electronic device according to the fourth embodiment of the present disclosure. In this embodiment, the second inorganic layer 306' can be disposed under or formed under the first auxiliary electrodes AE1 and/or the second auxiliary electrodes AE2. In this embodiment, the second inorganic layer 306' can be disposed between or formed between the auxiliary electrodes (such as the first auxiliary electrode AE1 and/or the second auxiliary electrode AE2) and the substrate 200.

Figure 8:
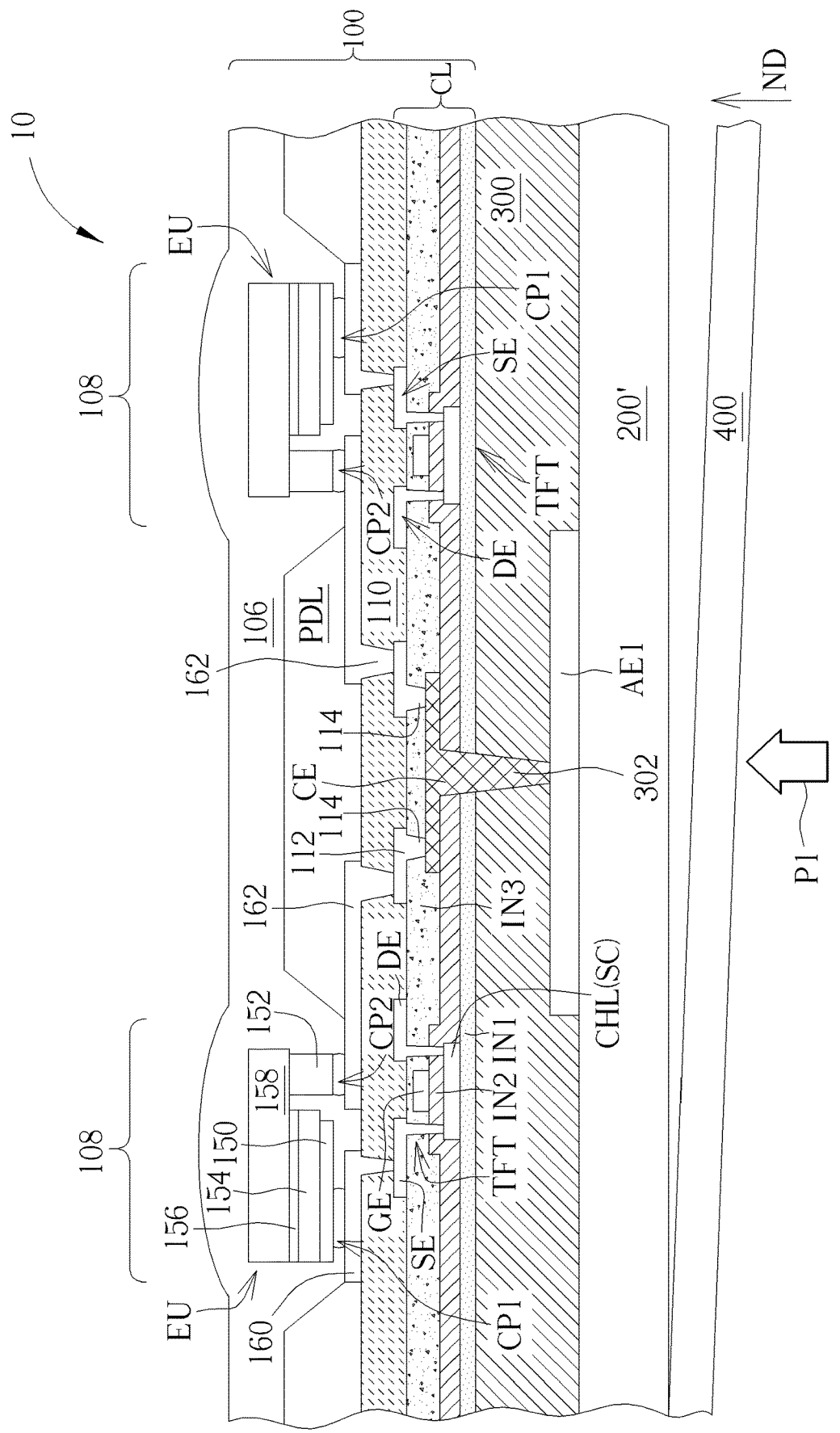
FIG. 8 is a schematic diagram showing a cross-sectional view of an electronic device according to the fifth embodiment of the present disclosure.

FIG. 8 is a schematic diagram showing a cross-sectional view of an electronic device according to the fifth embodiment of the present disclosure. In this embodiment, the substrate 200' can be a flexible substrate, and the flexible substrate 200' may include glass having thinner thickness, copper foil, polyimide (PI), polyethylene terephthalate (PET), polycarbonate (PC), polyethylene naphthalate (PEN), triacetate (TAC), epoxy resin, other suitable materials or combinations thereof. In some embodiments, a carrier substrate 400 is provided, and the substrate 200' and other components (such as the auxiliary electrodes, the thin film transistors and the electronic units, but not limited thereto) are disposed on or formed on the carrier substrate 400. The carrier substrate 400 is removed from the substrate 200' after disposing the above components, and the carrier substrate 400 may be removed by a lift-off process (such as a laser lift-off process P1 shown in FIG. 8) or other suitable methods. In some embodiments, the carrier substrate 400 may include a rigid substrate, and the material of the rigid carrier substrate 400 may include glass or other suitable materials.

Figure 9:
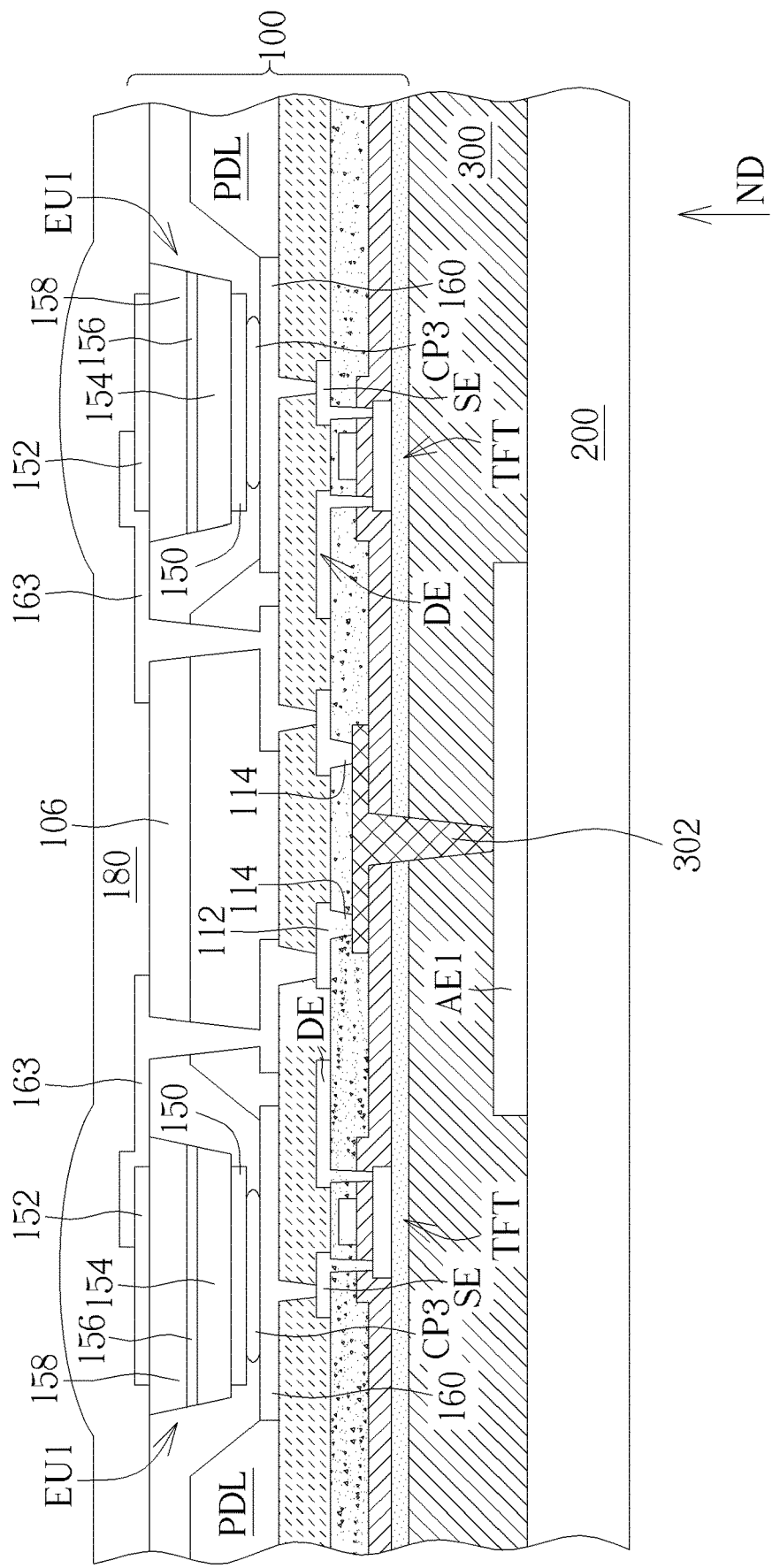
FIG. 9 is a schematic diagram showing a cross-sectional view of an electronic device according to the sixth embodiment of the present disclosure.

FIG. 9 is a schematic diagram showing a cross-sectional view of an electronic device according to the sixth embodiment of the present disclosure. In those embodiments mentioned above, the electronic units may include a flip-type LED (such as micro LED or mini LED) as an example. Compared with those embodiments mentioned above, the electronic unit EU1 may be a vertical-type LED (such as micro LED or mini LED) in sixth embodiment, but not limited thereto. In this embodiment, the common electrode 163 may contact or electrically connected to a second electrode 152 (such as cathode electrode) in the electronic unit EU1. In this embodiment, the first electrode 150 (such as anode electrode) may be electrically connected to the pixel electrode 160 through a conductive pad CP3, and the first electrode 150 may be electrically connected to the source electrode SE of a thin film transistor TFT (such as driving element), but it is not limited thereto. In some embodiments, the position of the drain electrode DE may be exchanged with the position of the source electrode SE. In some embodiments, a second protection layer 180 is disposed on (or cover) the electronic unit EU1.

Figure 10:
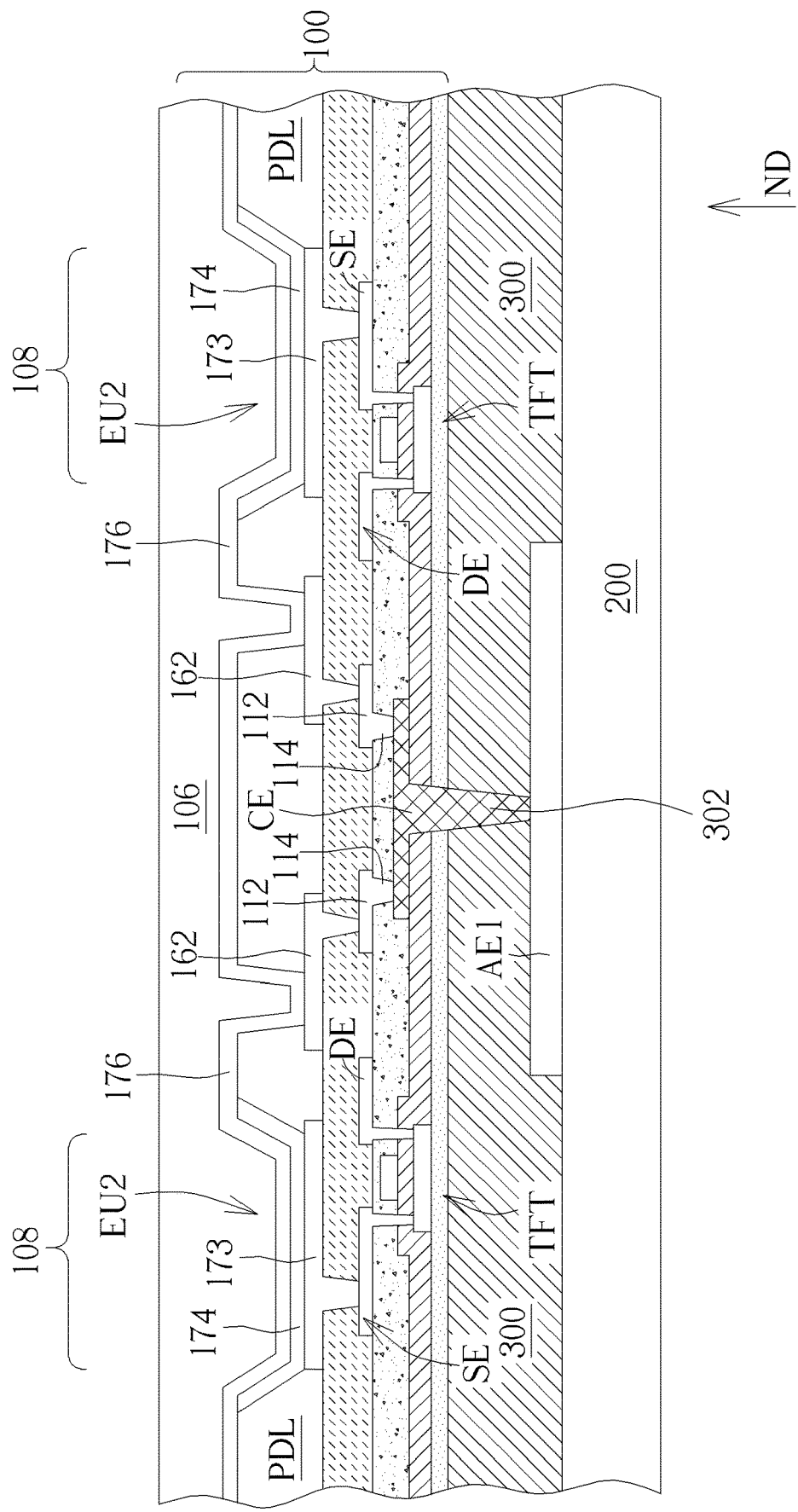
FIG. 10 is a schematic diagram showing a cross-sectional view of an electronic device according to the seventh embodiment of the present disclosure.

FIG. 10 is a schematic diagram showing a cross-sectional view of an electronic device according to the seventh embodiment of the present disclosure. In this embodiment, the electronic unit EU2 can include OLED. The electronic unit EU2 includes a corresponding first electrode 173, a corresponding portion of a second electrode layer 176 and a corresponding light emitting layer 174 disposed between the first electrode 173 and the second electrode layer 176. In this embodiment, the conductive via 302 is disposed in the organic layer 300, the conductive via 302 may be electrically connected to the first auxiliary electrode AE1 and the connection electrode CE, but it is not limited thereto.

In some embodiments (FIG. 10), the connection pads 112 and/or the conductive via 114 may be electrically connect to the connection electrode CE and the common electrodes 162 for electrically connecting at least two electronic units EU2 to the connection electrode CE, wherein the second electrode layer 176 is electrically connecting to the common electrodes 162, but it is not limited thereto.

Figure 11:
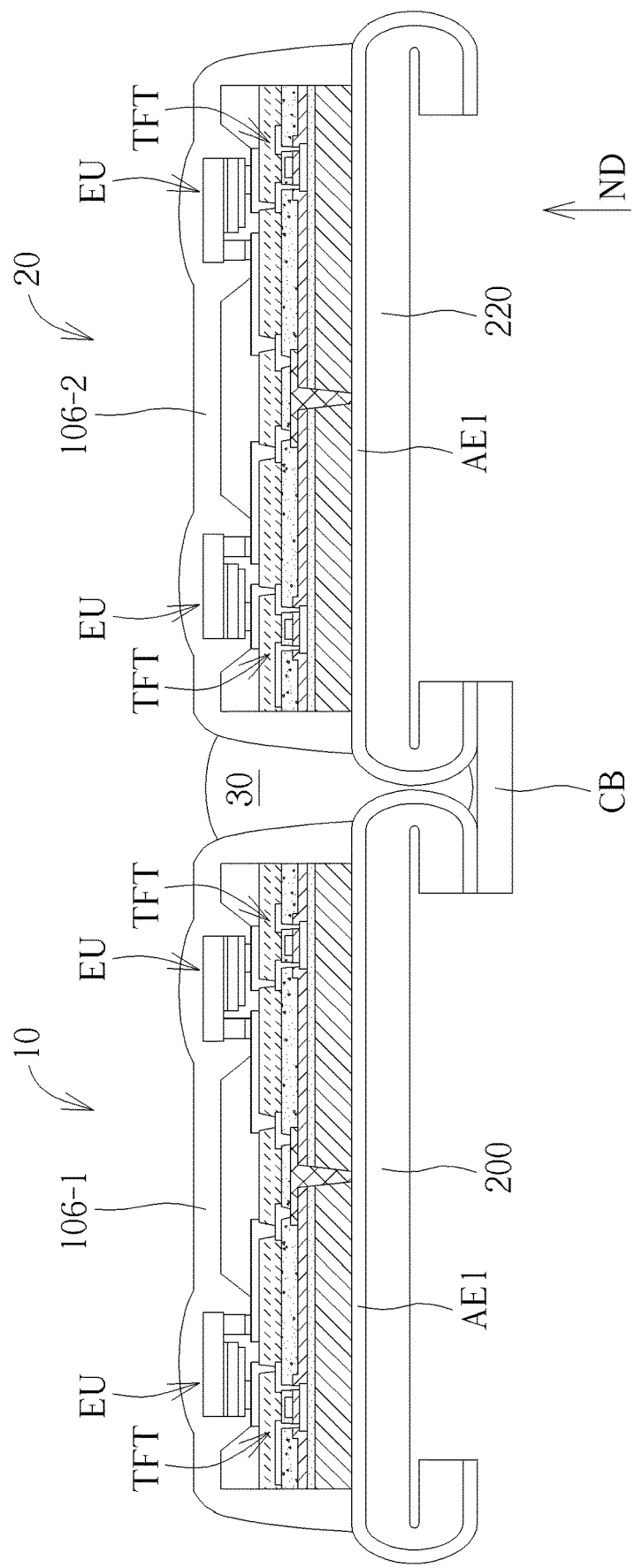
FIG. 11 is a schematic diagram showing a cross-sectional view of an electronic device according to the eighth embodiment of the present disclosure.

FIG. 11 is a schematic diagram showing a cross-sectional view of an electronic device according to the eighth embodiment of the present disclosure. In this embodiment, the electronic device can be tiled electronic device. As shown in FIG. 11, an electronic device 10 and a second electronic device 20 are provided, and the electronic device 10 is tiled with the second electronic device 20 through a connecting member 30, but it is not limited thereto. It is noteworthy that the electronic device 10 and the electronic device 20 can be replaced by any electronic device that mentioned in each embodiment above, the electronic device 10 and the second electronic device 20 may have the same structure or may have different structures. The connecting member 30 is used for connecting the electronic device 10 with the second electronic device 20. The connecting member 30 may include a conductive materials or non-conductive materials, such as a glue layer or the anisotropic conductive film (ACF), other suitable materials or a combination thereof, but it is not limited thereto. In other words, the connecting member 30 is disposed between the substrate 200 and the substrate 220 in the normal direction ND of the surface of the substrate 200. In addition, the substrate 200 in the electronic device 10 and/or the substrate 220 in the electronic device 20 may include flexible substrate, but it is not limited thereto, the substrate 100 and/or the substrate 200 can also include the rigid substrate. In some embodiments (FIG. 11), the first auxiliary electrode AE1 is formed on the substrate 200 (and/or the substrate 220). In some embodiments, part of the first auxiliary electrode AE1 formed on the substrate 200 (and/or the substrate 220) is bended. In some embodiments, part of the substrate 200 (and/or the substrate 220) may be bended and overlapped with the other part of the substrate 200 (and/or the substrate 220) in the normal direction ND of the surface of the substrate 200. In some embodiments, the first auxiliary electrodes AE1 in the electronic device 10 (and/or the electronic device 20) may be electrically connect to a circle board CB. In some embodiments, the circle board CB may include printed circuit board (PCB), printed flexible circuit (FPC), other suitable circuit board or combination thereof, but not limited thereto. In addition, the first auxiliary electrode AE1 in the electronic device 10 and the first auxiliary electrode AE1 in the electronic device 20 have the same potential. In some embodiments, the first protection layer 106-1 may be disposed to cover the electronic unit EU in the electronic device 10 and at least part of the first auxiliary electrode AE1 in the electronic device 10. In some embodiments, the first protection layer 106-2 may be disposed to cover the electronic unit EU in the electronic device 20 and at least part of the first auxiliary electrode AE1 in the electronic device 20.

Figure 12:
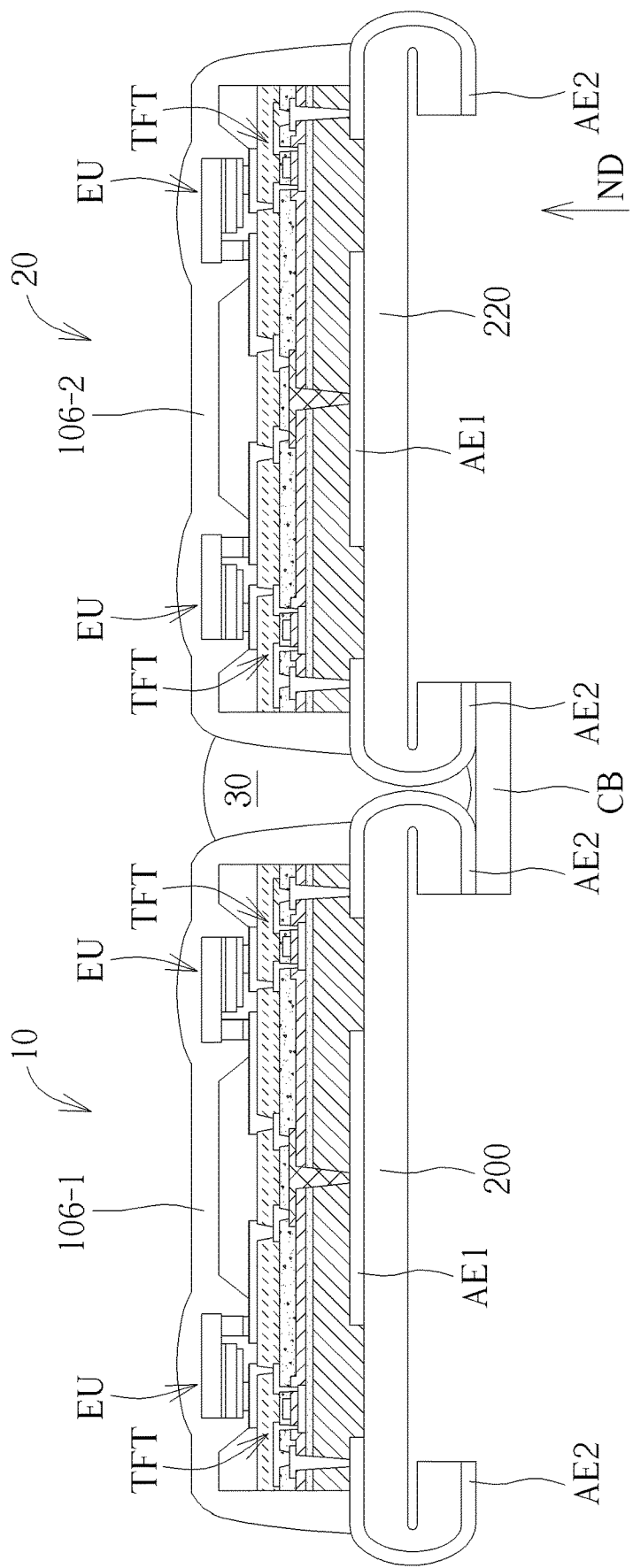
FIG. 12 is a schematic diagram showing a cross-sectional view of an electronic device according to the ninth embodiment of the present disclosure.

FIG. 12 is a schematic diagram showing a cross-sectional view of an electronic device according to the ninth embodiment of the present disclosure. In this embodiment, the electronic device can be a tiled electronic device. As shown in FIG. 12, the difference between the eighth embodiment (FIG. 11) and ninth embodiment is that, the electronic device 10 includes the first auxiliary electrode AE1 and the second auxiliary electrodes AE2, and the electronic device 20 includes the first auxiliary electrode AE1 and second auxiliary electrodes AE2, and the first auxiliary electrode AE1 and second auxiliary electrode AE2 is similar to the above the first auxiliary electrode AE1 and second auxiliary electrode AE2 shown in FIG. 7. In this embodiment, part of the second auxiliary electrode AE2 formed on the substrate 200 (and/or the substrate 220) and part of the substrate 200

(and/or the substrate 220) may be bended, and the second auxiliary electrode AE2 in the electronic device 10 and the second auxiliary electrode AE2 in the electronic device 20 may be electrically connected to a circle board CB, but not limited thereto In another embodiment of the present disclosure, two or more electronic devices are tiled with each other, and the electronic devices may have the first auxiliary electrode AE1 and/or the second auxiliary electrode AE2. In another embodiment, two electronic devices with different structures can be tiled with each other, for example, one of the electronic devices has the first auxiliary electrode AE1 and the second auxiliary electrode AE2, and another electronic device has the first auxiliary electrode AE1 but does not have the second auxiliary electrode AE2. It should also be within the scope of the present disclosure.

Although the disclosed embodiments and their advantages have been disclosed above, it should be understood that any person having ordinary knowledge in the art can make changes, substitutions and alterations without departing from the spirit and scope of the present disclosure. In addition, the scope of protection of the present disclosure is not limited to the processes, machines, manufacturing, material compositions, devices, methods, and steps in the specific embodiments described in the specification. Any process, machine, manufacturing, material compositions, devices, methods, and steps developed currently or in the future can be understood by those of ordinary skill in the art from the present disclosure, as long as substantially the same functions can be implemented or substantially the same results can be obtained in the embodiments described herein. Therefore, the scope of protection of the present disclosure includes the above processes, machines, manufacturing, material composition, devices, methods and steps. In addition, each patent application scope constitutes a separate embodiment, and the scope of protection disclosed in this disclosure also includes each patent application scope and combination of embodiments. The scope of protection disclosed herein shall be as defined in the appended patent application.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a substrate;
a first auxiliary electrode and a second auxiliary electrode formed on the substrate;
an organic layer formed on the first auxiliary electrode;
a plurality of thin film transistors formed on the organic layer; and
a plurality of electronic units electrically connected to the plurality of thin film transistors;
wherein the plurality of electronic units comprises a first electronic unit corresponding to a sub-pixel, a second electronic unit corresponding to another sub-pixel, the first auxiliary electrode and the second auxiliary electrode are electrically connected to the first electronic unit and the second electronic unit;
wherein the second auxiliary electrode is electrically insulate from the first auxiliary electrode.

2. The electronic device of claim 1, wherein the first auxiliary electrode transmits a constant voltage to the first electronic unit and the second electronic unit.

3. The electronic device of claim 1, further comprising an inorganic layer formed between the first auxiliary electrode and the substrate.

4. The electronic device of claim 1, further comprising an inorganic layer formed between the first auxiliary electrode and the organic layer.

5. The electronic device of claim 1, wherein a thickness of the organic layer ranges from 10 µm to 50 µm.

6. The electronic device of claim 1, wherein one of the plurality of thin film transistors comprises a channel layer not overlapped with the first auxiliary electrode in a normal direction of a surface of the substrate.

7. The electronic device of claim 6, wherein the one of the plurality of thin film transistors is a driving element.

8. The electronic device of claim 1, wherein a thickness of the first auxiliary electrode ranges from 1 µm to 6 µm.

9. The electronic device of claim 1, wherein the first auxiliary electrode comprises a material selected from a group consisting of Cu, Ag and Au.

10. The electronic device of claim 1, wherein the first auxiliary electrode is formed in a line structure, a mesh structure, or a combination thereof.

11. The electronic device of claim 1, wherein the second auxiliary electrode is electrically connected to the first electronic unit and the second electronic unit through at least two of the plurality of thin film transistors.

12. The electronic device of claim 1, wherein the first auxiliary electrode provides a first voltage, the second auxiliary electrode provides a second voltage, and the second voltage and the first voltage have different potentials.

13. The electronic device of claim 1, wherein at least a portion of the organic layer directly contact the substrate.

14. The electronic device of claim 1, wherein the plurality of electronic units are light emitting units, antenna units, sensor units, or a combination thereof.

15. The electronic device of claim 1, further comprising a common electrode disposed on the organic layer, wherein the common electrode is electrically connected to the plurality of electronic units and the first auxiliary electrode.

16. The electronic device of claim 15, further comprising a conductive via disposed in the organic layer, wherein the conductive via is electrically connected to the first auxiliary electrode and the common electrode.

17. The electronic device of claim 1, further comprising a connection electrode electrically connected with the plurality of electronic units.

18. The electronic device of claim 1, wherein one of the plurality of electronic units comprises a flip-type LED or a vertical-type LED.

19. The electronic device of claim 1, wherein-part of the first auxiliary electrode formed on the substrate is bended.

* * * * *